United States Patent [19]

Becker

[11] Patent Number: 5,753,565
[45] Date of Patent: May 19, 1998

[54] METHOD OF REDUCING OVERETCH DURING THE FORMATION OF A SEMICONDUCTOR DEVICE

[75] Inventor: David S. Becker, Boise, Id.

[73] Assignee: Micron Technology, Inc., Boise, Id.

[21] Appl. No.: 614,989

[22] Filed: Mar. 12, 1996

Related U.S. Application Data

[63] Continuation of Ser. No. 306,907, Sep. 15, 1994, Pat. No. 5,498,570.

[51] Int. Cl.⁶ ............................................. H01L 21/28
[52] U.S. Cl. .................. 438/586; 438/592; 438/738; 438/743; 438/744
[58] Field of Search .......................... 437/52, 187, 189, 437/195, 200, 208; 438/586, 592, 723, 724, 738, 743, 744

[56] References Cited

U.S. PATENT DOCUMENTS

| | | | |
|---|---|---|---|
| 3,288,662 | 11/1966 | Weisberg | 437/226 |
| 3,939,555 | 2/1976 | Jantsch et al. | 437/2 |
| 4,152,824 | 5/1979 | Gonsiovowski | 437/150 |
| 4,256,829 | 3/1981 | Daniel | 437/153 |
| 4,450,021 | 5/1984 | Batra et al. | 437/193 |
| 4,758,525 | 7/1988 | Kido et al. | 437/2 |
| 4,789,648 | 12/1988 | Chow et al. | 437/193 |
| 4,853,345 | 8/1989 | Himelick | 437/147 |
| 4,966,870 | 10/1990 | Barber et al. | 437/228 |
| 4,999,317 | 3/1991 | Lu et al. | 437/228 |
| 5,022,958 | 6/1991 | Favreau et al. | 437/228 |
| 5,084,416 | 1/1992 | Ozaki et al. | 437/193 |
| 5,286,674 | 2/1994 | Roth et al. | 437/190 |
| 5,321,211 | 6/1994 | Haslam et al. | 174/262 |
| 5,426,073 | 6/1995 | Imaoka et al. | 437/228 |

OTHER PUBLICATIONS

S. Wolf et al, "Silicon Processing For the VLSI Era, vol. 1", Lartice Press, 1986, pp. 168–171, 187–193.
Penkunas. et al, "Simultaneous Exposure of Photoresist on Both Sides of a Wafer", Western Electric Technical Digest No. 35, Jul. 1974, pp. 47–48.

Primary Examiner—John Niebling
Assistant Examiner—Thomas G. Bilodeau

[57] ABSTRACT

A method of forming a transistor for a semiconductor device from a semiconductor wafer comprises forming a first nitride layer over the front and back of the wafer, and forming a second nitride layer over the front and back of the wafer and over the first nitride layer. A first resist layer is formed over the front of the wafer and at least a portion of the second nitride layer over the front of the wafer is exposed. The first and second nitride layers are removed from the back of the wafer while, simultaneously, at least a portion of the exposed portion of the second nitride layer over the front of the wafer is removed. Next, a second layer of resist is formed leaving at least a portion of the first nitride layer exposed. Finally, the exposed portion of the first nitride layer is etched.

10 Claims, 4 Drawing Sheets

METHOD OF REDUCING OVERETCH DURING THE FORMATION OF A SEMICONDUCTOR DEVICE

PRIORITY INFORMATION

This application is a continuation of application Ser. No. 08/306,907, filed Sep. 15, 1994, now U.S. Pat. No. 5,498,570.

FIELD OF THE INVENTION

The invention relates to the field of semiconductor manufacture, and more specifically to a method for forming a contact region.

BACKGROUND OF THE INVENTION

During the formation of a semiconductor device, contacts, for example to the substrate or word line, are commonly formed. FIGS. 1-4 describe a method for simultaneously forming a portion of a transistor, contacts to a word line and a substrate.

In FIG. 1, a semiconductor wafer substrate 10 having a front and a back is layered with various materials. For example, a gate oxide layer 12, a polycrystalline silicon (poly) layer 14, a tungsten silicide layer 16, and an oxide separation layer 18 are formed on the front of the wafer, then a nitride layer 20A and 20B is formed over the entire wafer, including both the front (20A) and the back (20B), for example by thermally growing the layer. Some of the other materials (for example the gate oxide 12 and poly 14) may also be formed on the back of the wafer and removed by other processing steps. A patterned photoresist (resist) layer 22 is formed over the nitride layer 18 on the front of the wafer. The layers are etched using the resist layer 22 as a mask.

Next, a layer of spacer material 24, for example oxide or nitride, is formed over the front and back of the wafer to result in the structure of FIG. 2. A spacer etch can be performed at this point to form the spacers 30 as shown in FIG. 3, or the spacer etch can be formed after the back side nitride etch described later. The front of the wafer is protected, for example with a mask (not shown), and the material on the back of the wafer is removed, for example with a wet or, preferably, a dry etch. The material on the back of the wafer is removed to reduce the stress on the wafer caused by the properties of the nitride film. Wafer processing continues, for example to form a first layer of borophosphosilicate glass (BPSG) 32, a layer of tetraethyl orthosilicate (TEOS) 34, and a second layer of BPSG 36 as shown in FIG. 3. A resist layer 38 is patterned over the wafer, leaving exposed the areas of the wafer to which contacts are to be formed.

An etch is performed in an attempt to result in the structure of FIG. 4A. FIG. 4A shows a structure in which a contact 40 is made to the substrate 10 and a contact 42 is made to the layer of tungsten silicide 16. The layers 12-20 show a stack which forms a portion of a transistor (a word line stack). In a conventional process, stopping the etch at the substrate and at (or within) the layer of tungsten silicide (or some other layer) is difficult using a single etch, for example because the nitride etches slower than the BPSG. Typically, to achieve the tungsten silicide contact 42 a portion of the substrate will be removed as shown in FIG. 4B, which can produce an electrically undesirable cell. If the etch is stopped at the substrate, often contact will not be made to the tungsten silicide 16 but the contact will instead stop within the oxide 18 or nitride 20 as shown in FIG. 4C.

One method of solving this problem is to mask and etch the contact to the substrate, then mask and etch the contact to the tungsten silicide. This, however, adds an extra mask step which can create problems with alignment.

A process which forms a contact to the substrate and to another layer without adding an additional mask step is desirable.

SUMMARY OF THE INVENTION

A method of forming a semiconductor device from a semiconductor wafer having a front and a back comprises the steps of forming a layer of material over the front and back of the wafer, and forming a layer of resist over the front of the wafer and leaving at least a portion of the layer of material over the front of the wafer exposed. The layer of material is removed from the back of the wafer while, simultaneously, at least a portion of the exposed portion of the layer of material over the front of the wafer is removed.

Objects and advantages will become apparent to those skilled in the art from the following detailed description read in conjunction with the appended claims and the drawings attached hereto.

Figure 1:
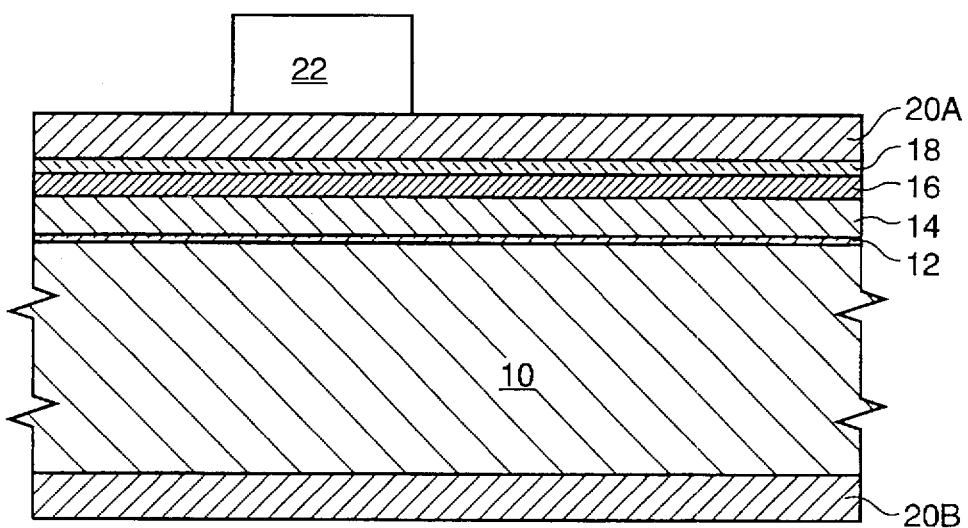
FIG. 1 is a cross section showing various layers on the front and back of a semiconductor wafer substrate.
Figure 2:
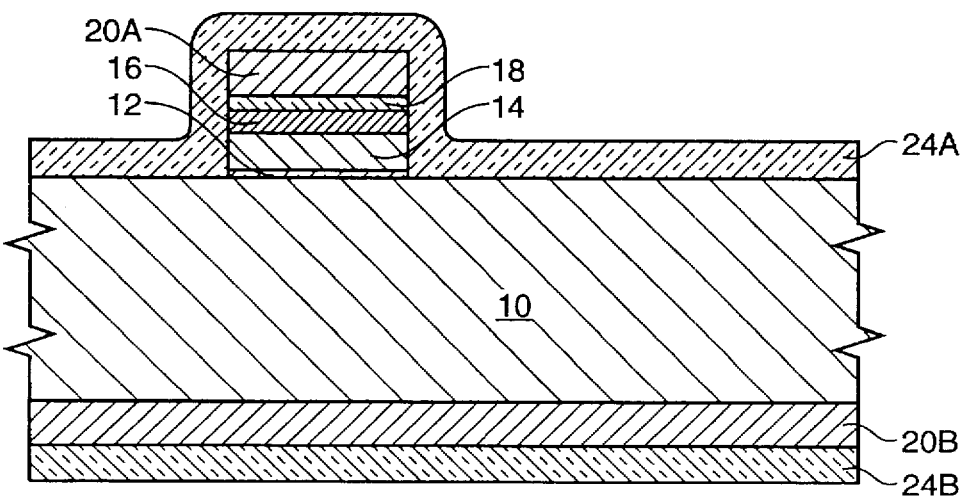
FIG. 2 is a cross section showing the FIG. 1 structure after an etch and after depositing another layer.
Figure 3:
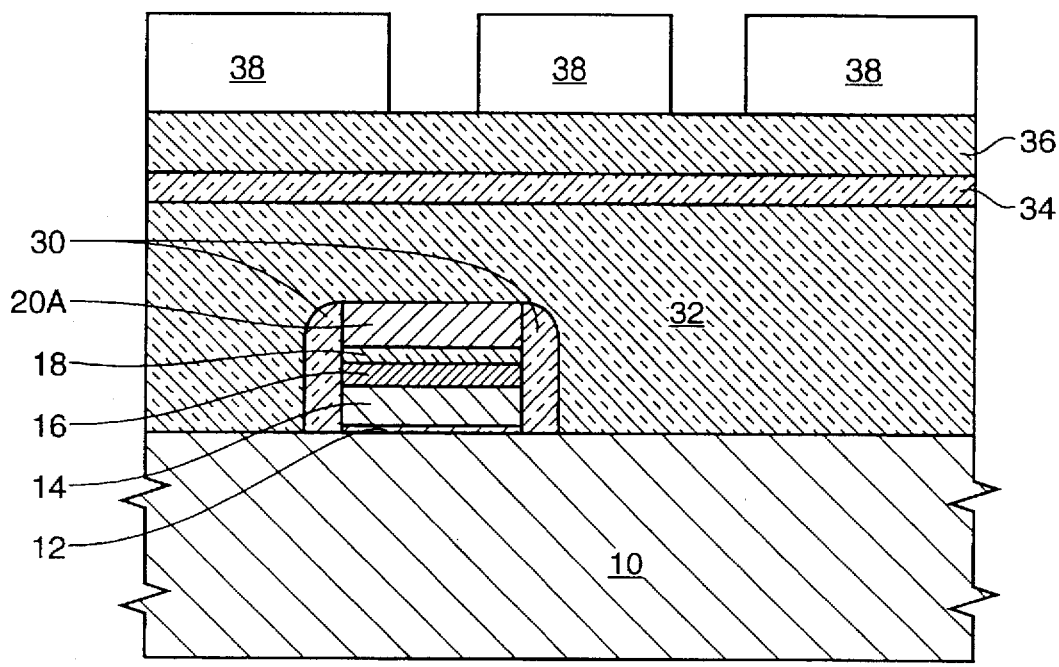
FIG. 3 is a cross section of the FIG. 2 structure after a spacer etch and after the addition of various layers.
Figure 4A:
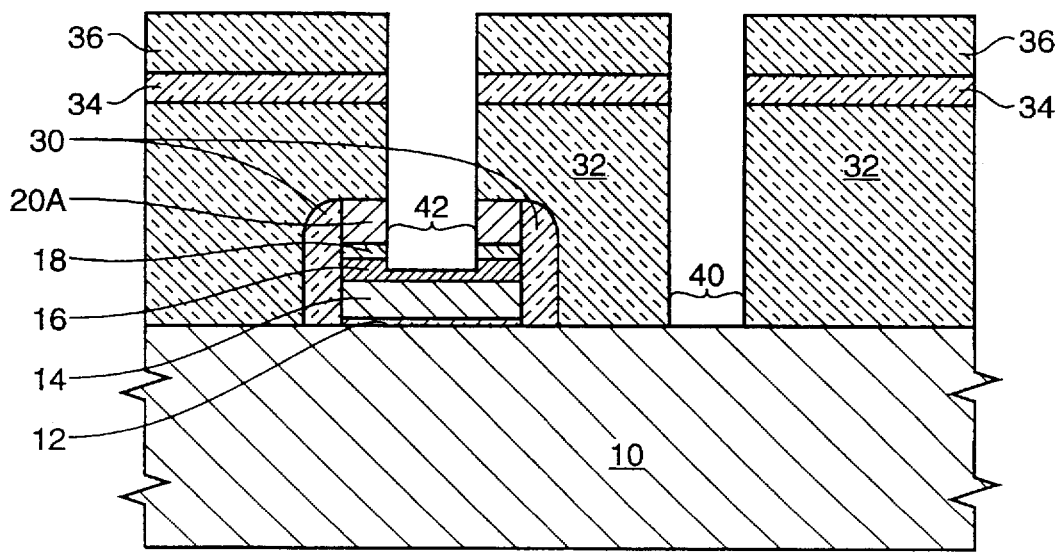
FIG. 4A is a cross section showing the structure of FIG. 3 after an etch with an ideal result.
Figure 4B:
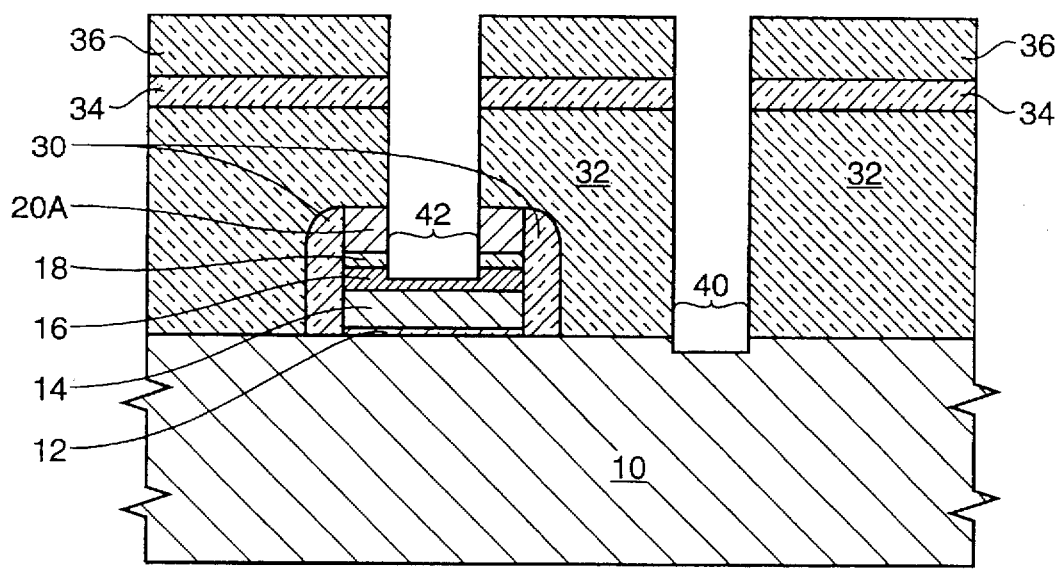
FIG. 4B is a cross section showing an overetched contact to the substrate with a desired silicide contact.
Figure 4C:
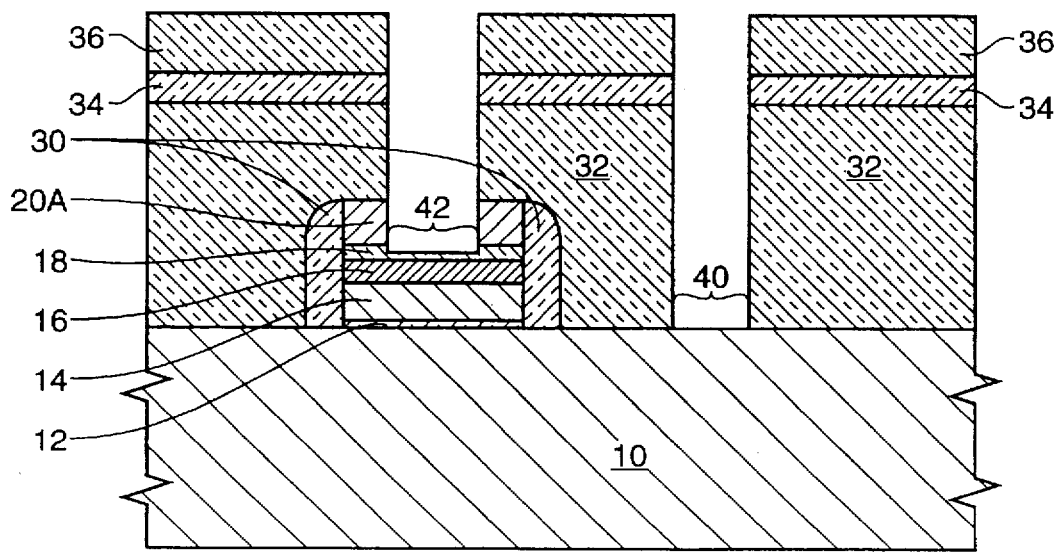
FIG. 4C is a cross section showing an underetched silicide contact with a properly etched substrate contact.

It should be emphasized that the drawings herein are not to scale but are merely schematic representations and are not intended to portray the specific parameters or the structural details of the invention, which can be determined by one of skill in the art by examination of the information herein.

DETAILED DESCRIPTION OF THE INVENTION

One embodiment of the inventive process is described by FIGS. 2, 4A and 5-6, for example to form a transistor for a semiconductor device. The structure of FIG. 2, or a similar structure, is formed according to means known in the art and a layer of resist is formed to result in the structure of FIG. 5. Thus FIG. 5 includes a semiconductor wafer 50 having a front and a back. A layer of material 52A and 52B, such as a nitride layer is formed over the front (52A) and back (52B) of the wafer, such as by formation of a thermally grown layer. Other layers may be formed over the front and back of the wafer as well, such as a gate oxide layer 54, a poly layer 56, a tungsten silicide layer 58, a dielectric 60, and a spacer material 62A, 62B, for example of nitride or oxide, as shown. A first layer of resist 64 is formed over the front of the wafer, and at least a portion of the layer of material 52A over the front of the wafer is exposed. It should be noted that layer 52A is exposed insofar as at least a portion of it is not covered by the resist 64, but it may be covered by other layers.

Layer 52B is removed from the back of the wafer, for example using a wet etch or, preferably a dry etch, and simultaneously (i.e. during the same etch), at least a portion of the exposed portion of layer 52A is removed from the front of the wafer. It may not be necessary to completely remove the exposed portion of layer 52A during this etch, but only a portion of the exposed portion may be removed. As can be seen from FIG. 6, only a portion of the exposed portion of layer 52A has been removed. However, the entire exposed portion of layer 52A could possibly be removed during the etch to the FIG. 5 structure. In any case, this etch "preetches" layer 52A as can be seen in FIG. 6.

Figure 5:
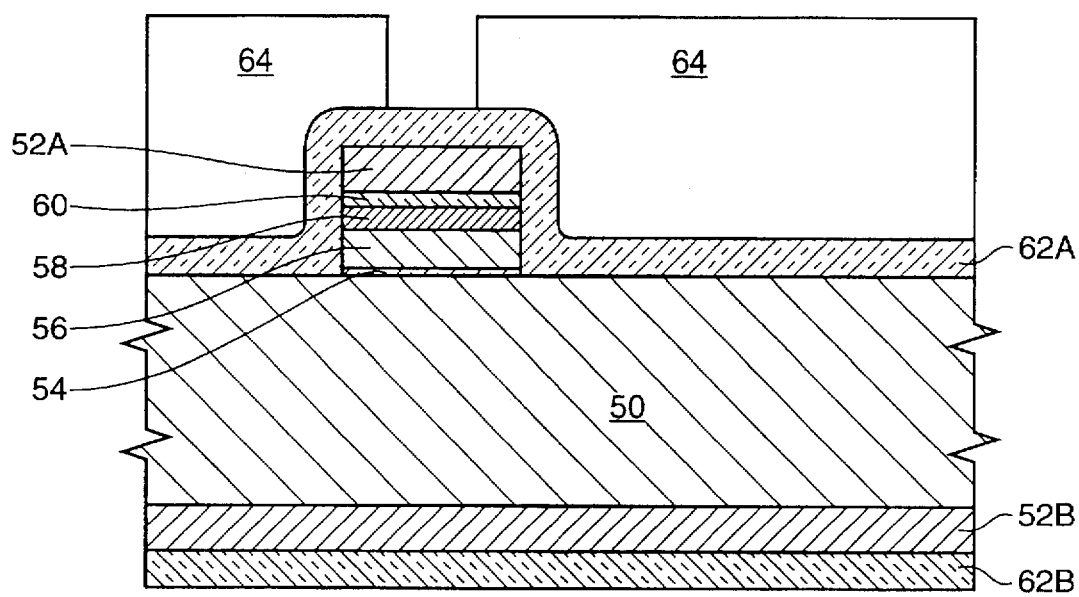
FIG. 5 is a cross section showing the FIG. 2 structure after the addition of a resist layer.

As can be seen from FIG. 5, a spacer layer 62A such as oxide or nitride, or other layers, may be formed over layer 52A prior to the formation of the resist layer 64. As shown, this spacer layer 62 is formed over the front and back of the wafer, and over layer 52. If used, this layer is etched after its formation as shown in FIG. 5 using the resist layer 64 as a mask. Additionally, as shown in FIG. 6, other layers such as BPSG and TEOS can be formed over the front of the wafer subsequent to the etch step.

If a spacer layer 62A is formed, the exposed portion as shown in FIG. 5 can be completely removed, or only a portion of it may be removed. If all of the exposed portion of layer 62A is removed, a portion of 52A may also be removed, and layer 52A may be further etched by a subsequent spacer etch. If only a portion of layer 62A is removed, any remaining portion of the exposed portion of layer 62A is removed after the removal of resist 64 and a subsequent spacer etch.

Figure 6:
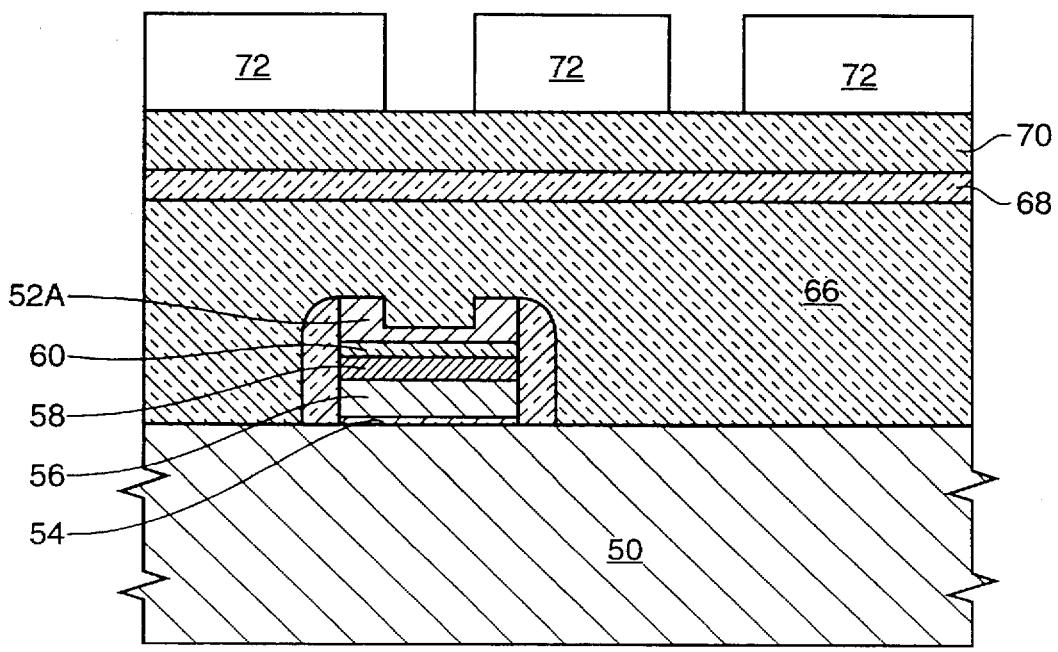
FIG. 6 shows the FIG. 5 structure after an etch and the addition of various layers.

After an etch of the FIG. 5 structure, wafer processing can continue to the point as shown in FIG. 6. For example, a spacer etch can be performed after the removal of layer 64, and other layers such as a first BPSG layer 66, a TEOS layer 68, and a second BPSG layer 70 can be formed over the front of the wafer subsequent to the etch step. Also shown in FIG. 6 is a second layer of resist 72 formed subsequent to the etch of the FIG. 5 structure. The resist layer 72 as shown leaves exposed any remaining portion of the exposed portion of layer 52A. After forming the FIG. 6 structure, an etch removes the exposed portion of layer 66 to expose the semiconductor wafer 50. If any exposed portion of layer 52A remains, layer 52A is further etched during this step to result in a contact region similar to contact region 42 in FIG. 4A. Etching continues until the substrate 50 is exposed to form a contact to the substrate similar to element 40 in FIG. 4A, and until contact is made to the tungsten silicide layer 58 to result in a structure similar to that of FIG. 4A. Subsequently, a conductive layer can be formed to contact the substrate and the tungsten silicide. As can be seen from the Figures, layers 52–60 can form a portion of a word line stack.

The invention as described is advantageous for example (referring to FIG. 5) as it adds only one mask 64 and one development step to the current process. The contact mask is formed in an existing resist layer 64 which is used to protect the front side of the wafer 50.

It may be preferable to leave a portion of layer 52A after the etch of the FIG. 5 structure to provide word line protection during subsequent implant steps. The removal of any portion of layer 52A during the etch of FIG. 5 is preferable as it reduces the nitride, the full thickness of which is responsible for the underetched contact to the silicide in conventional processes. Any remaining portion of the exposed portion of layer 52A will be removed during the etch of FIG. 6.

While this invention has been described with reference to illustrative embodiments, this description is not meant to be construed in a limiting sense. Various modifications of the illustrative embodiments, as well as additional embodiments of the invention, will be apparent to persons skilled in the art upon reference to this description. For example, the layers shown are illustrative, and various other layers are possible and likely. Structures other than contacts to a word line stack and the substrate would likely be improved with the inventive process as described. It is therefore contemplated that the appended claims will cover any such modifications or embodiments as fall within the scope of the invention.

What is claimed is:

1. A method used during the formation of a semiconductor device from a semiconductor wafer, the wafer having a front, a back, and at least one layer which comprises nitride over the front and a layer over the back, the method comprising the following steps:

forming a first mask over the front of the wafer such that a portion of said layer on said front of said wafer is uncovered by said mask;

etching said uncovered portion of said layer to form a preetched portion of said layer and simultaneously removing at least a portion of said layer from said back of said wafer;

forming a second mask over the front of the wafer such that said preetched portion of said layer is uncovered by said second mask;

further etching said preetched portion, wherein said layer forms a portion of a word line stack.

2. The method of claim 1 wherein said layer over said back comprises nitride.

3. The method of claim 2 wherein said layer on said back of said wafer is completely removed during said step of simultaneously removing said portion of said layer from said back of said wafer.

4. The method of claim 1 further comprising the steps of:

leaving a portion of said front of said wafer uncovered by said second mask;

during said step of further etching, opening a contact to said wafer.

5. A method of forming a semiconductor device comprising the steps of:

providing a semiconductor wafer having a transistor gate stack formed thereon which comprises a wafer assembly said wafer further having a layer over a back of said wafer;

forming a first mask over said wafer wherein said layer over said back of said wafer is exposed by said first mask;

etching said assembly;

etching said layer over said back during said step of etching said assembly;

forming a second mask over said wafer and etching said assembly and etching at least one other location, said other location having been covered by said first mask, wherein said layer over said back of said wafer is a layer used to form said gate stack.

6. A method used during the formation of a semiconductor device comprising the following steps:

providing a semiconductor wafer assembly comprising at least a silicide layer over a front of a semiconductor wafer and a nitride layer overlying said wafer and said silicide layer at a first location;

preetching said nitride layer at said first location;

forming a borophosphosilicate glass (BPSG) layer over said silicide and nitride layers at said first location; and etching through said nitride and BPSG layers at said first location to expose said silicide layer, said nitride layer etching at a substantially different rate than said BPSG layer, wherein said silicide, nitride, and BPSG layers form a portion of a gate stack.

7. The method of claim 6 wherein said nitride layer is formed over a back of said wafer, and said step of preetching removes said nitride layer from said back of said wafer.

8. A method used during the formation of a semiconductor device comprising the following steps:

providing a semiconductor wafer having a front and a back;

forming a conductive layer over said front of said wafer, and forming a first layer over said conductive layer;

preetching said first layer at a first location;

forming a second layer over said first layer; and etching said second layer and said first layer to expose said conductive layer at said first location and said wafer at a second location, wherein said conductive layer and said first layer form a portion of a gate stack.

9. The method of claim 8 wherein said first layer etches at a slower rate than said second layer.

10. The method of claim 9 wherein said first layer is formed from a different material than said second layer.

* * * * *